United States Patent
Dudderar et al.

(10) Patent No.: US 6,297,551 B1
(45) Date of Patent: Oct. 2, 2001

(54) INTEGRATED CIRCUIT PACKAGES WITH IMPROVED EMI CHARACTERISTICS

(75) Inventors: Thomas Dixon Dudderar, Chatham; Dean Paul Kossives, Glen Gardner; Yee Leng Low, Berkeley Heights, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/401,690

(22) Filed: Sep. 22, 1999

(51) Int. Cl.$^7$ ................................................. H01L 23/34
(52) U.S. Cl. .................... 257/723; 257/686; 257/738; 257/778; 257/779; 257/780; 361/717; 361/748; 361/761; 361/764
(58) Field of Search .......................... 257/685, 686, 257/713, 723, 724, 738, 778, 779, 737, 701, 780; 361/717, 722, 748, 761, 764, 744, 760

(56) References Cited

U.S. PATENT DOCUMENTS

| | | | |
|---|---|---|---|
| 4,903,120 | * | 2/1990 | Beene et al. ........................... 257/704 |
| 5,198,963 | * | 3/1993 | Gupta et al. ........................... 361/386 |
| 5,521,435 | * | 5/1996 | Mizukoshi ........................... 257/698 |
| 5,541,450 | * | 7/1996 | Jones et al. ........................... 257/697 |
| 5,608,262 | * | 3/1997 | Degani et al. ........................ 257/723 |
| 5,639,989 | * | 6/1997 | Higgins, III ........................... 174/35 |
| 5,646,828 | * | 7/1997 | Degani et al. ........................ 361/715 |
| 5,715,144 | * | 2/1998 | Ameen et al. ........................ 361/790 |
| 5,869,894 | * | 2/1999 | Degani et al. ........................ 257/723 |
| 5,953,213 | * | 9/1999 | Napierala ............................. 361/760 |
| 6,125,042 | * | 9/2000 | Verdi et al. ........................... 361/760 |
| 6,137,693 | * | 10/2000 | Schwiebert et al. .................. 361/803 |
| 6,154,370 | * | 11/2000 | Degani et al. ........................ 361/761 |
| 6,201,403 | * | 3/2001 | Rollin et al. ........................... 324/765 |

FOREIGN PATENT DOCUMENTS 60-10764 * 1/1985 (JP).
5-48000 * 2/1993 (JP).

* cited by examiner

Primary Examiner—Olik Chaudhuri
Assistant Examiner—Alonzo Chambliss
(74) Attorney, Agent, or Firm—Peter V. D. Wilde; Thomas, Kayden, Horstemeyer & Risley LLP

(57) ABSTRACT

The specification describes a recessed chip MCM package with integrated electromagnetic shielding. The surfaces of the cavity which houses the IC devices are coated with metallization. The normally exposed top and side surfaces of the MCM package are also metallized. A solder wall is provided on the interconnect PCB which seals the gap between the MCM tile and the PCB interconnect substrate. The solder wall can be formed using standard solder bump technology, and the seal between the MCM and the PCB may be made during the same reflow operation that is used to flip-chip bond the MCM tile to the PCB.

10 Claims, 1 Drawing Sheet

INTEGRATED CIRCUIT PACKAGES WITH IMPROVED EMI CHARACTERISTICS

FIELD OF THE INVENTION

This invention relates to integrated circuit devices, and more particularly to flip-chip IC packages having improved electromagnetic interference (EMI) characteristics.

BACKGROUND OF THE INVENTION

A variety of integrated circuit packages are used for packaging semiconductor devices. Dual in-line packages (DIPs), pin grid arrays (PGAs), and surface mount packages have been widely used for many years. More recent package embodiments use flip-chip approaches and advanced interconnection substrates. Recessed chip multichip module (MCM) packages have been introduced in manufacture to reduce the package profile. In general, the state of the art package designs have relatively good EMI performance due largely to the short length of interconnections in BGA or solder bumped packages, and the compact interconnect strategy made possible by state of the art multichip modules. However, as operating frequencies continue to rise, even these package designs suffer from EMI problems. Operating frequencies in wireless applications are in the several to tens of gigabit range. Specialized computing devices also operate at these speeds. In these high frequency applications, even the relatively short leads of BGA and solder bumped packages are susceptible to stray electromagnetic radiation.

To combat EMI problems in IC packages, EMI shields are often incorporated in the package design. So-called Faraday cages in the form of wire grids have been built around the IC chip to shield the interconnections from stray fields. Metal cans are also provided to "encapsulate" IC chips and leads. These cans are usually fabricated using stamped metal (typically copper or aluminum). Consequently they add cost, size and weight to the IC package. In an effort to reduce the size and weight of the can, resort is made to perforating portions of the can. This reduces the bulk of the can but does not decrease the cost. Moreover, it reduces the effectiveness of the EMI shield.

As is known, EMI is disruptive to the proper operation of circuit components located near the source of the EMI. Accordingly, there is an identifiable need to reduce EMI susceptibility.

SUMMARY OF THE INVENTION

To achieve reduced EMI susceptibility, an integrated circuit package has been designed that avoids the drawbacks of the prior art packages described outlined above. In accordance with a principle aspect of the invention, a recessed flip-chip package is provided with an internal EMI shield which is incorporated into the package itself. The flip-chip MCM tile is metallized around the external surfaces of the substrate. The PCB into which the MCM tile is recessed, hereinafter referred to as the MCM PCB, is provided with a solder wall corresponding to the peripheral shape of the MCM tile, and the MCM tile and MCM PCB are joined with the solder wall completely surrounding the IC chip. The solder wall on the MCM PCB is connected to a ground plane that surrounds the cavity into which the IC device(s) is recessed. In this manner the MCM cavity is completely isolated from stray EMI.

DETAILED DESCRIPTION OF THE INVENTION

In the preferred embodiment of the invention the EMI metallization shield is incorporated into a recessed flip-chip MCM package. Recessed chip MCM packages are gaining acceptance in IC device interconnection technology because of efficient utilization of interconnect substrate area, low overall package profile, and reduced interconnection length. A variety of recessed chip package options are described and claimed in U.S. Pat. No. 5,608,262, issued Mar. 4, 1997 which, for purposes of this disclosure, is incorporated herein by reference.

Recessed chip packages are characterized by three components, a primary IC chip, defined for the purpose of this exposition as a first level component, an MCM interconnection substrate (IS) which may be either an IC chip or a passive interconnection substrate, defined here as a second level component, and an MCM printed circuit board (PCB), defined as a third level component. These components are progressively larger in area so that the second level component(s) can support one or more IC chips, and the third level components can accommodate one or more second level components. In a three component package, the first level components are typically flip-chip bonded to the second level components, and the second level components are flip-chip mounted on the third level component with the first level components recessed into cavities formed in the third level component.

A number of variations using this basic concept are possible, e.g. the PCB designated the third level of the recessed chip MCM package can itself function as an intermediate interconnection PCB and attach to a fourth board level, e.g. a system PCB, with the second level components recessed into cavities in the fourth level component. All of the structures just described are ideally adapted for implementing the EMI shield of the invention.

Figure 1:
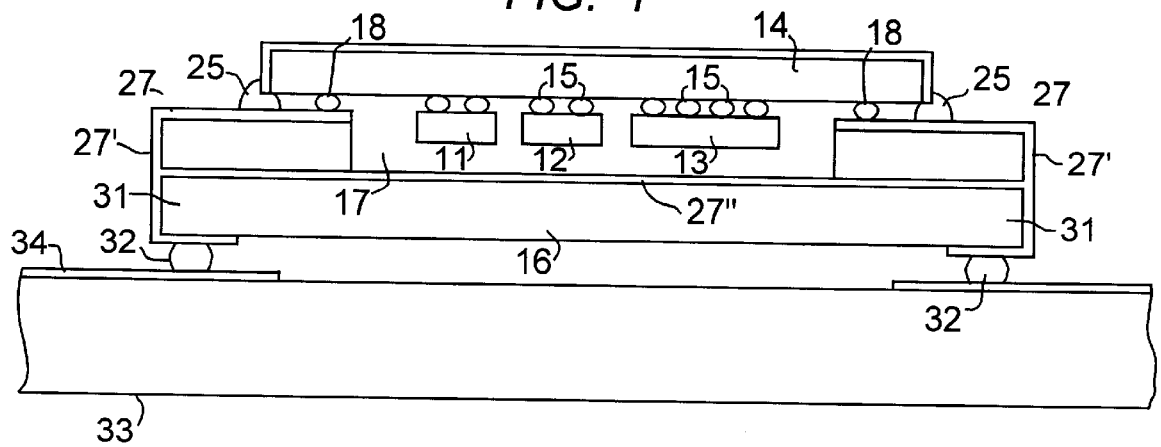
FIG. 1 is a schematic view of a recessed chip MCM with EMI shielding according to the invention.

Referring to FIG. 1, integrated circuit devices 11, 12 and 13 are shown flip-chip bonded to multi-chip module (MCM) substrate 14. The IC devices may be packaged or unpackaged, and are solder bump bonded, typically with microbumps 15, to the MCM substrate. The MCM substrate may be an epoxy printed circuit board (PCB), or may be a ceramic or silicon interconnect substrate. The MCM substrate 14 is in turn flip-chip mounted onto another interconnect substrate 16. Substrate 16 is typically an epoxy PCB with a cavity 17 to accommodate devices 11, 12 and 13 on the MCM substrate 14 in a recessed configuration. In the embodiment shown, PCB 16 is a multilevel board with two levels. The MCM tile, i.e. the IC chips and substrate 14, is interconnected to PCB 16 by solder bumps or balls, represented in these figures by elements 18. As illustrated, the solder interconnections 18 are signal or power interconnections. Other interconnections, e.g. antenna, or standard I/O interconnections, are not shown but may be present and are made in the conventional way.

According to the invention, an EMI shield is incorporated into the flip-chip package shown. The upper side of the package is provided with metallization 21 which covers the entire surface of the MCM tile that is normally exposed, i.e. the top and sides. In the case where substrate 14 is a silicon interconnection substrate, the backside of the substrate, with the substrate ground plane metallization, is combined with the EMI shield. The EMI shield metallization 21 can be as thick as desired but, in contrast to the thick metal can of the prior art, the integrated EMI shield can be comparatively very thin, e.g. less than 4 μm, and preferably less than 2 μm. As shown, the EMI metallization 21 extends along the sidewalls of the substrate in a continuous fashion. Metallization 21 may be applied by evaporation or other suitable technique and may be any conductive material, e.g. Ni, Al or Cu. It is preferably applied prior to flip-chip attachment of substrate 14 to the PCB 16. Alternatively, this portion of the package may be metallized after assembly.

Prior to reflow attachment of the MCM tile to PCB 16, the PCB is provided with solder wall 25. The solder wall extends around the entire periphery of the MCM tile, and may be formed by conventional solder bump application, e.g. by screening solder paste onto substrate 16. The solder wall is formed on EMI shield metallization 27, and EMI shield metallization 27 extends beneath the entire wall 25. EMI shield metallization 27 has portion 27' extending over the edge of PCB 16 and portion 27" extending beneath cavity 16 so as to be continuous over the substrate 16 and enclose the entire cavity as shown. The portion 27" of the EMI shield metallization is conveniently the standard inter-level metal of multilevel PCB 16, and the edge metallization portion 27' may also be part of a standard PCB.

The IC ground connection between MCM substrate 14 and PCB 16 in FIG. 1 is made via solder wall 25, and the EMI metallization including portions 27 and 27', edge metallization 31, and solder bump/ball 32. The PCB 16 is shown attached to a system PCB 33 with solder balls 32. The solder balls 32 are interconnected to system level interconnections via runners 34. It will be recognized that the IC device ground shares a portion of the EMI shield metallization on the interconnection substrate 16. Various other arrangements may occur to those skilled in the art.

The bottom portion 27" of the EMI shield metallization is shown in FIG. 1 on the intermediate level between the two levels of the multilevel PCB, and adjacent the cavity 17. In an alternative arrangement the EMI shield metallization is formed at a level below that shown. For example, in a three level PCB where the cavity 17 is formed in the top level, the EMI shield metallization can alternatively be formed between the top and intermediate levels (as shown in FIG. 1) or between the intermediate and lower levels. The EMI shield metallization can also be positioned along the bottom surface of the PCB. In all of these cases, the important feature is that the EMI shield is a metallization coating or interlevel PCB metal layer that essentially completely surrounds the recessed portion of the MCM package.

In some cases it may be desirable to route one or more IC chip interconnections through the EMI shield metallization. For example, a power lead or an antenna lead may be provided on the top surface of the MCM substrate and extend through the substrate 14 to the IC devices 11–13. In such cases, a portion of the EMI shield metallization is pierced by the interconnection(s) and electrically isolated therefrom. Accordingly, the EMI shield metallization is specified as "essentially" surrounding the MCM substrate. It is expected that the area involved in provided I/O access through the EMI shield will be less than 10% of the area of the EMI shield.

The preferred technique for assembling the package of the invention is to provide solder wall 25 on the interconnection substrate 16 and reflow both the solder bond attachments 18 and the solder wall 25 in the same reflow operation. Another possibility is to use a higher melting solder for solder wall 25 and attach the device interconnections in a first reflow operation. The package can be tested at this point and the EMI shield metallization completed by reflowing the solder wall in a second reflow operation.

The solder bumps or balls described in this specification can be formed by any suitable technique such as ball placement and solder paste printing. The thickness of a typical solder bump for this application is 5–30 mils. Examples of solder compositions that can be used successfully in the processes described here are given in the following table:

TABLE I

| composition | Sn | Pb | Bi | solidus ° C. | liquidus ° C. |
|---|---|---|---|---|---|
| I | 63 | 37 | | 183 | 183 |
| II | 42 | | 58 | 138 | 138 |
| III | 43 | 43 | 14 | 143 | 163 |

In the embodiment where the solder for the solder wall is a higher melting solder the compositions given in the following table may be suitable:

TABLE II

| composition | Sn | Pb | Ag | Sb | solidus ° C. | liquidus ° C. |
|---|---|---|---|---|---|---|
| I | 95 | | | 5 | 235 | 240 |
| II | 96.5 | | 3.5 | | 221 | 221 |
| III | 10 | 90 | | 275 | 302 | |

The liquidus points of the IC interconnect solders should be lower than the solidus points of the high melting solders for the solder wall. It is preferred that the difference between solidus temperatures of the bonding solder be at least 20° C., and more preferably at least 40° C. lower than the liquidus temperatures of the fill solder. It may be inferred from the tables that common bonding solders have liquidus temperatures below 190° C. The high melting point compositions in the table have solidus temperatures above 220° C. In general, for the purposes of the invention the high melting point solder will have a solidus temperature above 200° C.

Figure 2:
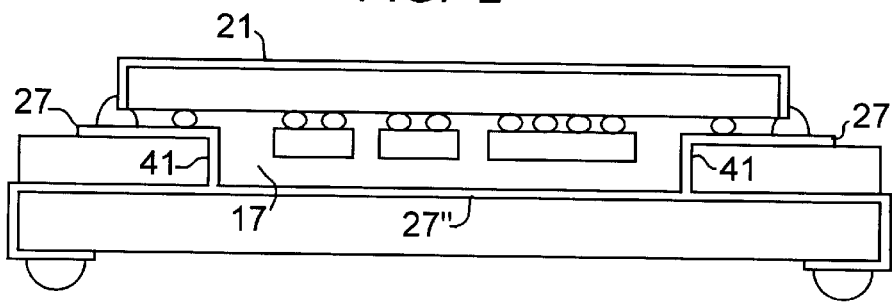
FIG. 2 is a schematic view similar to that of FIG. 1 showing an alternative EMI shielding arrangement.

An alternative arrangement for the EMI shield metallization is shown in FIG. 2. Here the EMI shield metallization extends along the inside wall of cavity 17 as shown at 41, and connects with the EMI cavity shield metallization 27" as in the arrangement of FIG. 1. Here the system level PCB is omitted for simplicity.

Figure 3:
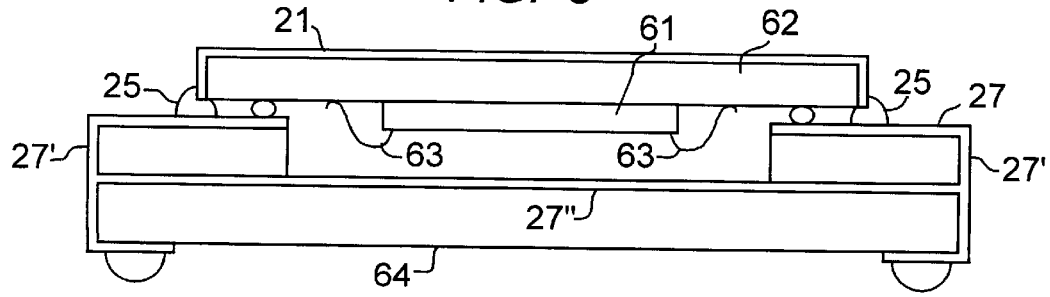
FIG. 3 is a schematic view similar to those of FIGS. 1 and 2 illustrating a wire bonded flip-chip IC device shielded according to the invention.

Because the EMI shield arrangement of the invention is so compact and efficient, devices that normally would not be used in an EMI sensitive application or environment may be used to advantage. For example, wire bonded IC devices are typically relatively robust and cost effective. However, wire bond leads are long and extremely susceptible to EMI. When used with the EMI shield of the invention, as shown in FIG. 3, the EMI problem can be overcome for many applications. FIG. 3 shows a wire bonded IC 61 attached to interconnection substrate 62, and substrate 62 is flip-chip assembled to interconnection PCB 64. The IC 61 is interconnected to substrate 62 with wire bonds 63. The EMI shield metallization is essentially the same as shown in FIG. 1, comprising metallization 21, solder wall 25, and PCB metallization 27, 27' and 27".

The MCM tile is shown and described as comprising IC devices 11, 12 and 13. In addition, passive or other components may be attached to the MCM tile and recessed in the cavity in a manner similar to that shown with devices 11, 12 and 13.

As stated earlier, the preferred substrate for the MCM tile is silicon, and the metal layer 21 preferred in that case is a combination of Al, as the primary ground plane layer, coated with Cr—Cu—Cr for bonding to solder wall 25. The Cr—Cu—Cr layer is preferably the same as the under bump metallization typically used in flip-chip bump bonding of the MCM substrate to the PCB. To facilitate localized or selective application of solder to the array of MCM solder bump contact pads, and to adhere the solder wall to the sides of the MCM, the surface of the pads and the sides of the MCM should be solder wettable. The standard ground plane for the MCM substrate is aluminum and it is well known that aluminum is not a desirable material to solder. Consequently the practice in the industry is to apply a metal coating on the portions of aluminum that are to be soldered, and reflow the solder to the coating. This coating is referred to as under bump metallization (UBM). The metal or metals used in UBM technology must adhere well to aluminum, be wettable by typical solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and the solder will then de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

The EMI metallization on the PCB side of the structure is typically copper, and can be soldered by reflow or other methods directly.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. An IC MCM package comprising:
   a. a printed circuit board (PCB) with a top surface and a bottom surface and an edge between said top surface and said bottom surface, and having a cavity formed in the top surface, said cavity having a sidewall surface and a bottom surface, a first metal electromagnetic interference (EMI) layer enclosing said cavity, and a first array PCB interconnection site on the top side of said PCB,
   b. a multichip module (MCM) comprising:
      i. an interconnection substrate (IS) with a top side and a bottom side and a peripheral edge between said top side and said bottom side, said IS having a first array of IS interconnection sites on said bottom side and adapted for interconnection to an IC chip, said IS having a second metal EMI layer covering said top side and said peripheral edge,
      ii. a second array of IS interconnection sites on the bottom side of the interconnection substrate said second array of IS interconnection sites adapted for interconnection with said first array of PCB interconnection sites, and
      iii. at least one IC chip with an array of IC chip interconnection sites on said IC chip, said IC chip being flip chip bonded to the bottom side of said IS with said array of chip interconnection sites bonded to said to a first array of IS interconnection sites, said IC chip extending into said cavity,
   said MCM interconnected to said PCB with said second array of IS interconnection sites bonded to said first array of PCB interconnection sites leaving a space between said first metal EMI layer and said second metal EMI layer,
   the IC MCM package further including:
   c. a solder wall on said PCB extending around said IS and attached to the edge of said IS and attached to said PCB so as to fully enclose said space between said first metal EMI layer and said second metal EMI layer.

2. The IC MCM package of claim 1 wherein said PCB is a multilevel PCB with at least two board levels and a conductive layer therebetween.

3. The IC MCM package of claim 2 wherein said first metal EMI layer extends from said solder wall over said edge and contacts said conductive layer of said multilevel PCB whereby said conductive layer comprises a portion of said first metal EMI layer.

4. The IC MCM package of claim 2 wherein said first metal EMI layer extends from said solder wall over said sidewall of said cavity and contacts said conductive layer of said multilevel PCB whereby said conductive layer comprises a portion of said first metal EMI layer.

5. An IC MCM package comprising:
   a. a system printed circuit board (SPCB) having at least one SPCB interconnection site,
   b. an intermediate printed circuit board (IPCB) with a top surface and a bottom surface and having a cavity formed in the top surface, a first metal electromagnetic interference (EMI) layer enclosing said cavity, and a first array IPCB interconnection site on the top side of said IPCB and at least one second IPCB interconnection site on the bottom side of said IPCB, said IPCB being interconnected to said SPCB with said first IPCB interconnection site bonded to said SPCB interconnection site,
   c. a multichip module (MCM) comprising:
      i. an interconnection substrate (IS) with a top side and a bottom side and a peripheral edge between said top side and said bottom side, said IS having a first array of IS interconnection sites on said bottom side and adapted for interconnection to an IC chip, said IS having a second metal EMI metal layer covering said top side and said peripheral edge,
      ii. a second array of IS interconnection sites on the bottom side of the interconnection substrate said second array of IS interconnection sites adapted for interconnection with said first array of IPCB interconnection sites, and
      iii. at least one IC chip with an array of IC chip interconnection sites on said IC chip, said IC chip flip chip bonded to the bottom side of said IS with said array of chip interconnection sites bonded to said first array of IS interconnection sites, said IC chip extending into said cavity, said MCM being interconnected to said IPCB with said second array of IS interconnection sites bonded to said second array of IPCB interconnection sites leaving a space between said first EMI metal layer and said second EMI metal layer, the IC MCM package further including:

d. a solder wall on said IPCB extending around said IS and attached to the edge of said IS and attached to said IPCB so as to fully enclose said space said first metal EMI layer and said second metal EMI layer.

6. The IC MCM package of claim 5 wherein said IPCB is a multilevel PCB with at least two board levels and a conductive layer therebetween.

7. The IC MCM package of claim 6 wherein said first metal EMI layer extends from said solder wall over said edge and contacts said conductive layer of said multilevel PCB whereby said conductive layer comprises a portion of said first metal EMI layer.

8. The IC MCM package of claim 6 wherein said first metal EMI layer extends from said solder wall over said sidewall of said cavity and contacts said conductive layer of said multilevel PCB whereby said conductive layer comprises a portion of said first metal EMI layer.

9. The IC MCM package of claim 5 wherein said IC chip is wire bonded to said IS.

10. The IC MCM package of claim 5 wherein said second array of IS interconnection sites is bonded to said second array of IPCB interconnection sites with a first solder material and said solder wall comprising a second solder material, the solidus temperature of said second solder material at least 20° C. higher than the liquidus temperature of said first solder material.

* * * * *